United States Patent [19]

Tanaka et al.

[11] 4,135,964
[45] Jan. 23, 1979

[54] METHOD OF MANUFACTURING DIE FOR EMBOSSING CIRCUIT PATTERN

[75] Inventors: Yasuyuki Tanaka, Isuchiura; Kazuo Nakajima, Inashiki, both of Japan

[73] Assignee: Nippon Mektron Kabushiki Kaisha, Tokyo, Japan

[21] Appl. No.: 791,289

[22] Filed: Apr. 27, 1977

[30] Foreign Application Priority Data

Nov. 30, 1976 [JP] Japan .............................. 51-144195
Sep. 28, 1976 [JP] Japan .............................. 51-116843

[51] Int. Cl.$^2$ .......................... C23F 1/02; C23C 1/00; C03C 15/00; C03C 25/06
[52] U.S. Cl. ........................................ 156/661; 96/36; 101/28; 156/905
[58] Field of Search ...................... 29/527.2, 557, 558; 156/661, 905, 209, 219, 220; 96/35, 36, 36.3, 37; 101/3 R, 28-32

[56] References Cited

U.S. PATENT DOCUMENTS 4,053,348  10/1977  Weglin .............................. 156/905 X

*Primary Examiner*—William A. Powell

[57] ABSTRACT

A method of manufacturing a die for embossing a desired circuit pattern of a metal foil onto a substrate comprises steps of forming, on the work surface of die material, a first circuit-coating pattern corresponding to the contour of the desired circuit pattern and a second circuit-coating pattern large enough to cover the first circuit-coating pattern and larger than the desired circuit pattern. The die material surface uncovered by the second circuit-coating pattern is partly etched away to leave a grooving for receiving the embossed metal foil. Then, the second circuit-coating pattern is stripped away, and the uncovered metal portion surrounded by the first circuit-coating pattern is suitably removed, and finally the first coating pattern is stripped away.

15 Claims, 40 Drawing Figures

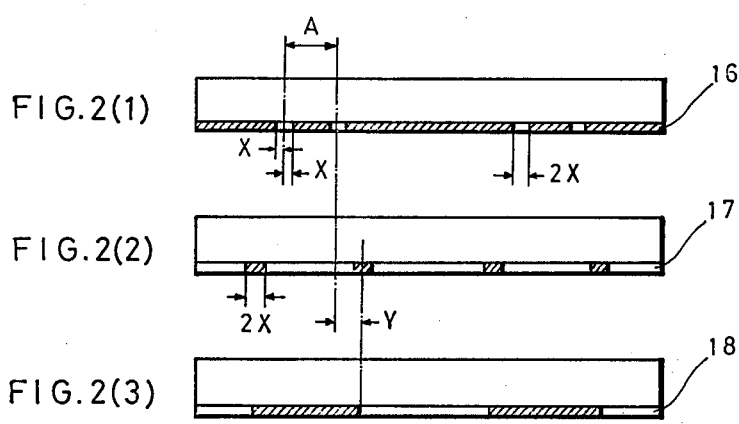
FIG. 2(1)
FIG. 2(2)
FIG. 2(3)
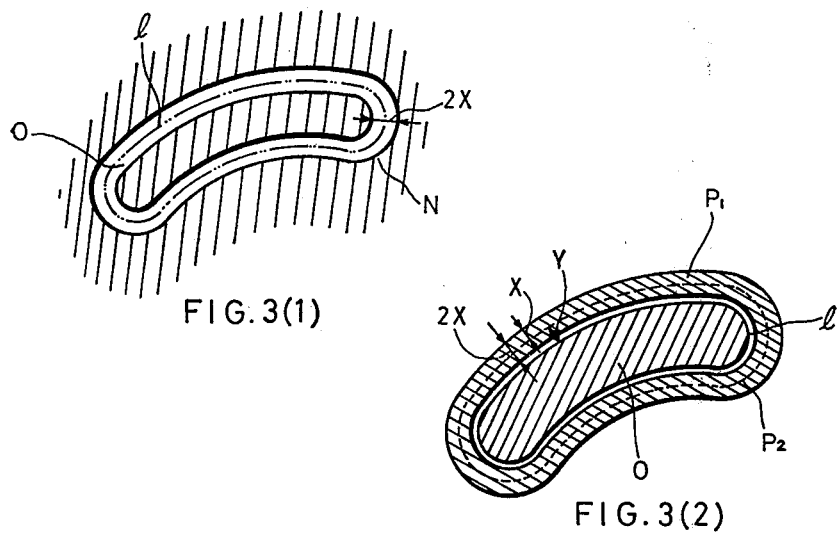
FIG. 3(1)
FIG. 3(2)

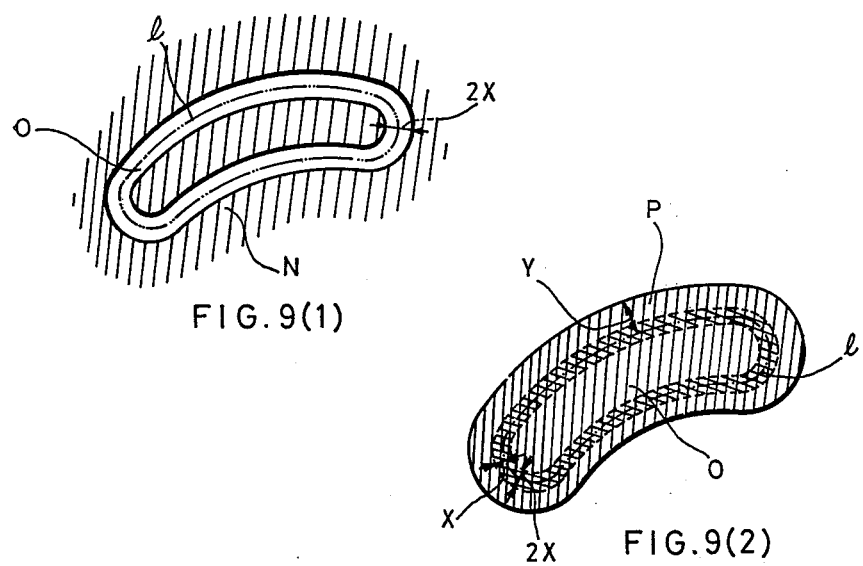
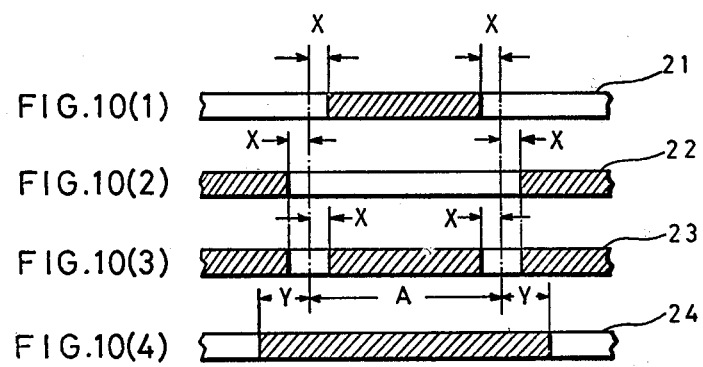

METHOD OF MANUFACTURING DIE FOR EMBOSSING CIRCUIT PATTERN

BACKGROUND OF THE INVENTION

This invention relates to a method of manufacturing a die for embossing a desired circuit pattern of a metal foil onto a substrate, and more specifically to a method of manufacturing a die for embossing a circuit pattern by photoetching.

For the prior art methods of fabricating such dies by photoetching, essential steps have been, typically, to pack a grooving, preformed for receiving the embossed metal foil, uniformly with a resin and to form photoresist coats thereon in two stages. The packing of the grooving with a resin is usually accomplished by evenly filling an anticorrosive resin, such as an epoxy resin, into the grooving prefromed on the die material surface. However, the resin filling calls for much time and skill. In addition, the formation of photoresist coats by means of films after the resin filling again requires skill in bringing the films in good register. In the final stage the resin must be thoroughly removed from the grooving. For these reasons it has heretofore been extremely difficult to obtain a die of desirable quality despite the complexity of the process steps needed for the fabrication.

SUMMARY OF THE INVENTION

It is an object of the present invention to provide a method of manufacturing a die for embossing a circuit pattern, which solves the foregoing problems of the conventional methods and makes it possible to obtain a die of constant and high quality easily by a simplified process.

Another method of the invention is to provide a novel method in which first and second circuit-coating patterns necessary to form the desired circuit pattern can be simply formed and the two coating pattern can be readily positioned in register.

To realize these objects, the method of the invention essentially comprises the steps of starting with formation of a first circuit-coating pattern with a negative photoresist coat by use of a negative film in such a manner as to occupy the edging or contour of the desired circuit pattern on a die material surface pretreated as desired, and forming, over the first coating pattern, a second cicuit-coating pattern large enough to cover the desired circuit pattern and suitably larger than the first circuit-coating pattern with a positive photoresist coat of less resistance than the first pattern by use of a positive film, and also characterized by the subsequent steps of removing the remaining uncovered metal portion by etching to form a grooving adjacent to the desired circuit pattern for receiving the embossed metal foil, suitably stripping away the second circuit-coating pattern with a stripping solution or by means of a developer or the like after the exposure of the pattern or light, etching away the metal portion uncovered inside the first circuit-coating pattern, and lastly stripping away the first circuit-coating pattern to form the desired circuit pattern with a knife-edged configuration.

A modified method of the invention starts with the formation of a first circuit-coating pattern with a positive photoresist coat or the like in such a manner as to leave the contour or edging of the desired circuit pattern on a pretreated die material surface, and comprises the subsequent steps of forming a second circuit-coating pattern, in the spacing as the contour or edging of the circuit pattern left uncovered by the first coating pattern, by means of plating or the like fairly more resistant than the first coating pattern, suitably removing part of the first coating pattern by means of exposure to light and development so that it can take a larger size than the second coating pattern, etching away the metal portion of the die material uncovered by the removal to form an adequate grooving for receiving the embossed metal foil, stripping away the remainder of the first coating pattern and removing the uncovered metal portion surrounded by the second coating pattern, and finally stripping away the second coating pattern and finishing the portion corresponding to the edging or contour of the circuit pattern in a knife-edged fashion. In the series of process steps mentioned above, the first coating pattern directly serves as a protective coat when the grooving for receiving the embossed metal foil is formed. This combines with the very high resistance of the second coating pattern to provide the grooving rapidly and accurately. According to the invention, therefore, an excellent die can be obtained which can form a fine circuit pattern, while the entire process is being efficiently operated through simple treatments.

The present invention also contemplates the provision of a further modification in which, before proceeding to the step of partially stripping the first coating pattern so as to take a larger size than the second coating pattern, a third coating pattern of the same material as the first and second coating patterns is laminated therewith, and then the stripping is carried out. In this case, the subsequent step of etching to provide the grooving for receiving the embossed metal foil can be accomplished more rapidly and reliably than in the procedures already described.

The invention will be better understood from the following detailed description when taken in conjunction with the accompanying drawings showing preferred embodiments thereof.

BRIEF DESCRIPTION OF THE DRAWINGS

FIG. 1(2) is a fragmentary sectional view of the die material coated with a photoresist on the surface;

FIG. 1(3) is a fragmentary sectional view, on an enlarged scale, of the die material with a first circuit-coating pattern formed in the photoresist coat;

FIG. 1(4) is an enlarged, fragmentary sectional view showing a positive photoresist coat formed over the die material surface and also over the first circuit-coating pattern thereon;

FIG. 1(5) is an enlarged, fragmentary sectional view showing the positive photoresist coat partly removed to form a second circuit-coating pattern suitably larger than the first pattern;

FIG. 1(6) is an enlarged, fragmentary sectional view showing the uncovered die material surface portion outside of the second circuit-coating pattern removed by etching to provide a grooving for receiving the embossed metal foil;

FIG. 1(7) is an enlarged, fragmentary sectional view showing the first circuit-coating pattern left alone after stripping of the second circuit-coating pattern;

FIG. 1(8) is an enlarged, fragmentary sectional view showing a recess formed by suitable etching of the uncovered metal portion of the die material surface surrounded by the first circuit-coating pattern;

FIG. 1(9) is an enlarged, fragmentary sectional view showing a complete die obtained by stripping away the first circuit-coating pattern;

FIG. 2(1) is a schematic view showing the structure of a negative film to be used in forming the first circuit-coating pattern;

FIG. 2(2) is a schematic view showing the structure of one of two positive films to be used in forming the second circuit-coating pattern;

FIG. 2(3) is a schematic view showing the structure of the other positive film to cooperate with the positive film of FIG. 2(3);

FIG. 3(1) is a schematic view explanatory of the structure of the negative film of FIG. 2(1);

FIG. 3(2) is a schematic view explanatory of the structure of the positive films of FIGS. 2(2) and (3);

FIG. 7(2) is a schematic, fragmentary sectional view, on an enlarged scale, showing the positive photoresist coat partly stripped away to provide a spacing large enough to cover the contour of the desired circuit pattern;

FIG. 7(3) is an enlarged, fragmentary sectional view showing the spacing filled with a metal material by plating means to form a first circuit-coating pattern;

FIG. 7(4) is an enlarged, fragmentary sectional view showing the positive photoresist coat stripped to provide a second circuit-coating pattern larger than the first circuit-coating pattern;

FIG. 7(5) is an enlarged, fragmentary sectional view showing the uncovered metal portion of the die material surface outside of the second circuit-coating pattern etched away to form a grooving for receiving the embossed metal foil;

FIG. 7(6) is an enlarged, fragmentary sectional view showing the first circuit-coating pattern left alone after stripping of the second circuit-coating pattern;

FIG. 7(7) is an enlarged, fragmentary sectional view showing a recess formed by suitable etching of the uncovered metal portion of the die material surface surrounded by the first circuit-coating pattern;

FIG. 7(8) is an enlarged, fragmentary sectional view showing a complete die obtained by stripping away the first circuit-coating pattern;

FIG. 8(2) is an enlarged, fragmentary sectional view like FIG. 7(2), showing the positive photoresist coat partly stripped away to provide a spacing large enough to cover the contour of the desired circuit pattern;

FIG. 8(3) is an enlarged, fragmentary sectional view similar to FIG. 7(3);

FIG. 8(4) is an enlarged, fragmentary sectional view showing an additional positive photoresist coat formed over the resist coat of FIG. 8(3) and the first circuit-coating pattern;

FIG. 8(5) is an enlarged, fragmentary sectional view showing the two positive photoresist coats stripped to provide a second circuit-coating pattern larger than the first circuit-coating pattern;

FIG. 8(6) is an enlarged, fragmentary sectional view similar to FIG. 7(5), showing the uncovered metal portion of the die material surface outside of the second circuit-coating pattern etched away to form a grooving for receiving the embossed metal foil;

FIGS. 8(7), (8), and (9) are enlarged, fragmentary sectional views corresponding and similar to FIGS. 7(6), (7), and (8), respectively;

FIG. 9(1) is a schematic view showing the structure of a positive photoresist film for use in carrying out the step of FIG. 7(2) or 8(2);

FIG. 9(2) is a schematic view showing the structure of a positive photoresist film for use in forming the second circuit-coating pattern as in FIG. 7(4) or 8(5);

FIGS. 10(1), (2), and (3) are schematic views explanatory of the step of preparing the positive photoresist film of FIG. 9(1); and FIG. 10(4) is a view explanatory of the step of preparing the positive photoresist film of FIG. 9(2).

DESCRIPTION OF THE PREFERRED EMBODIMENTS

Figure 1:
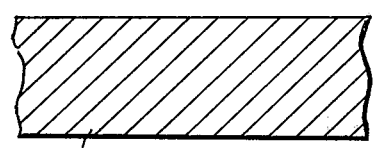
FIG. 1(1) is a fragmentary sectional view of a die material prepared on the surface.
Figure 1:
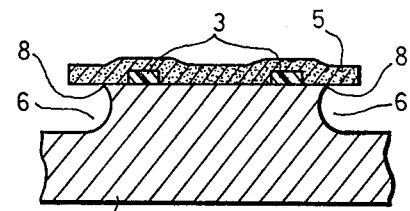
Figure 1:
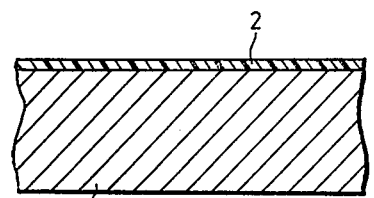
Figure 1:
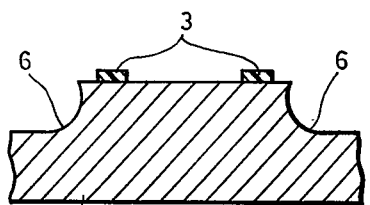
Figure 1:
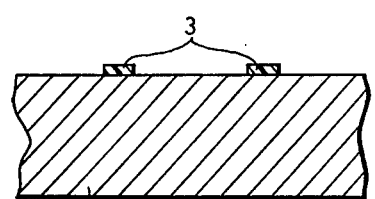
Figure 1:
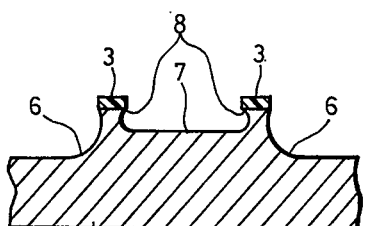
Figure 1:
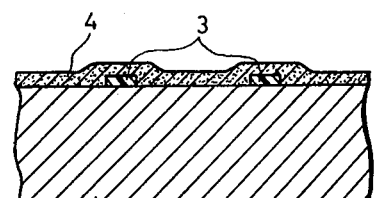
Figure 1:
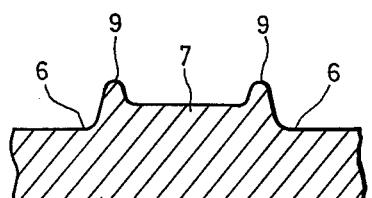
Figure 1:
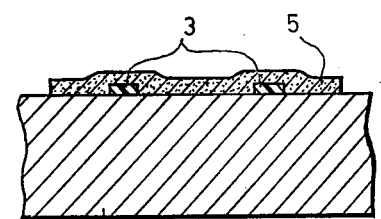

Prior to the fabrication, the surface of the die material 1 to be used, as shown in FIG. 1(1), is heat-treated for hardening, the hardened surface is mechanically polished to a depth of about 0.2 to 0.3 mm, and then it is finished by a suitable chemical treatment, such as pickling with phosphoric acid or the like following deoxidation with vaporized trichloroethylene, for example, Before the surface of the die material 1 thus prepared oxides, it is rapidly coated with a photoresist to form a coat 2 thereon as shown in FIG. 1(2). This photoresist coat can form a first circuit-coating pattern 3, as in FIG. 1(3), which will fully occupies the edging, or contour, of the desired circuit pattern, as it is exposed to light using a negative photoresist film 16 to be described later in connection with FIG. 2(1). Next, as indicated in FIGS. 1(4) and (5), the die material surface including the pattern 3 is uniformly coated with a positive photoresist. The resulting coat 4 is exposed to light using positive photoresist films 17, 18 to be described later and illustrated in FIGS. 2(2) and (3), when a second circuit-coating pattern 5 which overlies, and is suitably larger than, the coating pattern 3 will result. The properties of the both coating patterns 3, 5 must satisfy a given set of conditions. For example, it is desirable that the coating pattern 3 is formed of a negative photoresist of the rubber or polycinnamate type and the other coating pattern 5 is formed of a diazo-type positive photoresist, so that when the first circuit-coating pattern 3 is exposed and hardened the pattern will attain adequate resistance and remain unremoved by the developer or stripping solution for the second circuit-coating pattern 5. Choice of such conditions will eliminate the possibility of the first circuit-coating pattern 3 of the exposed and hardened negative photoresist being attacked by the alkaline developer for the second circuit-coating pattern 5 of the positive photoresist. Consequently, this facilitates the operation of the process according to the invention now to be described.

The metal portion uncovered adjacent to the thus-obtained coating pattern 5, as shown in FIG. 1(5), is then etched away to a desired depth, as in FIG. 1(6), to provide a grooving 6 for subsequently receiving the metal foil at the time of embossing. The etching solution to be used for this purpose is usually a ferric chloride solution having a Baume reading of about 37° and heated to about 50° C. Other solutions which will not attack the photoresist, or the second circuit-coating pattern 5 may be employed as well. Next, the positive photoresist coat as the coating pattern 5 is entirely exposed to light and this positive coat alone is removed by use of a developer, when the first circuit-coating pattern 3 is uncovered as in FIG. 1(7). Since the developer used does not attack the negative photoresist as the coating pattern 3, the latter formed in the step of FIG. 1(3) remains unremoved. If the negative photoresist used is resistant to the stripping solution for the positive photoresist, the exposure of the entire surface to light is not necessary; the positive photoresist coat may be removed with the stripping solution immediately after the etching as in FIG. 1(6). For example, where the positive photoresist used is "AZ 111" (trademark) of Shipley Co. and the negative photoresist is Eastman Kodak Co.'s "KTFR" (trademark), a treatment for a proper period of time will eliminate the danger of KTFR impairing the circuit-coating pattern 3, inasmuch as AZ 111 is readily stripped off with methyl ethyl ketone. In this manner the positive photoresist coat is removed and the portion of die material inside the pattern 3 is etched away to a desired depth, forming a recess 7 therein as indicated in FIG. 1(8). The recess 7 should be approximately a tenth millimeter deep and, as it is formed, a slight overhang (burr) is concomitantly produced on the side-etched portion. Finally, the negative photoresist as the pattern 3 is removed using a designated stripping solution, when, as shown in FIG. 1(9), a blading 9 of a contour corresponding to the desired circuit pattern can be formed. The blading 9 retains the overhang 8, which can be removed by dipping into the etching solution for a short period of time. Such an overhang is quick to react chemically and is removable without imparting an adverse effect upon the remaining portion of the die. In order to minimize the overhanging, it is effective to add an agent for preventing side etching to the etching solution. This is because the additive combines with the metal wall surface of the die to form a chelate compound so that the etching speed of the wall where the spray pressure of the etching solution is lower than at the bottom that is subjected to a higher spray pressure. Cleared from the overhang in the manner described, the resulting die as illustrated in FIG. 1(9) may be directly used as a die.

Figure 4:
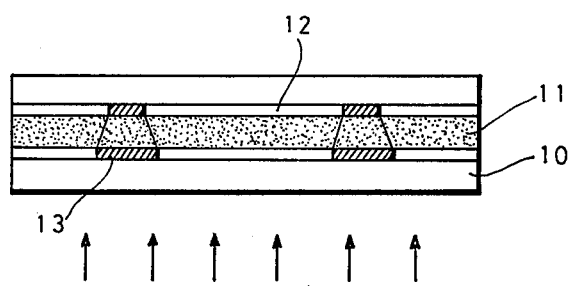
FIG. 4 is a schematic view explanatory of the step of preparing the negative and positive films for forming the first and second circuit-coating patterns from master films, with a line-width adjustment.
Figure 5:
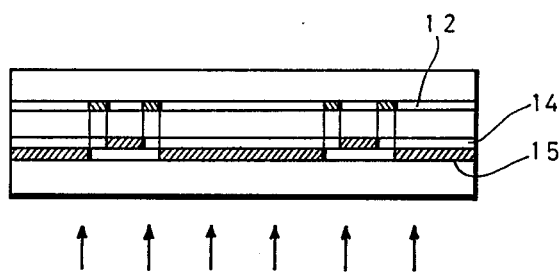
FIG. 5 is a schematic view explanatoty of the step of eventually forming negative and positive films for actual use.
Figure 6:
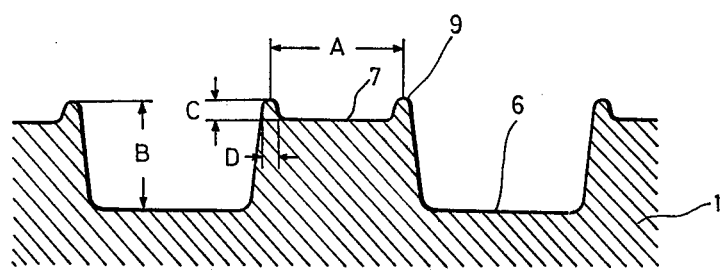
FIG. 6 is a view illustrating the required dimensions of a finished die.

For the foregoing sequence of steps for forming the first and second circuit-coating patterns 3, 5, it is necessary to prepare, in advance, as shown in FIGS. 2(1) to (3), a piece of negative film 16 corresponding to the coating pattern 3 and one piece each of positive films 17, 18 corresponding to the coating pattern 5. The negative film 16 is formed, as can be seen from FIG. 3(1), to have a line pattern N extended an equal distance of X mm from both sides of the side edge, or contour line 1, of the desired circuit pattern O. On the other hand, the positive film 17, as shown in FIGS. 2(2) and 3(2), is given a line pattern $P_1$ extended an equal distance of X mm from the both sides of a line a distance of Y mm outside of the contour line 1 of the desired circuit pattern O. Likewise, the other positive film 18 is given a line pattern $P_2$ extended a distance of Y mm uniformly outwardly of the contour line 1. The values of X and Y may be chosen depending upon the size of the die to be fabricated, as indicated in FIG. 6, or it may be defined by the following equations:

$$X = C/E + D/2$$

$$Y = B/E + D/2$$

under the conditions $$2C/E < X < A$$

where
A: size of the desired circuit pattern
B: depth of the grooving 6 for receiving the embossed metal foil
C: depth of the recess 7
D: desired size of the edge of blade 9
E: etching factor The negative and positive films 16, 17, and 18 that meet the foregoing requirements can be easily obtained by suitably controlling the exposure to light during reversal of corresponding master films 10. FIGS. 4 and 5 illustrate a procedure for obtaining those films. A transparent polyester film 11 of a suitable thickness is sandwiched between a pair of master films superposed with a pair of unexposed films 12. The integral laminate or sandwich is exposed to light, when the line pattern N or patterns $P_1$, $P_2$ can be controlled with extreme ease. The line-width adjustment is accomplished by suitably changing the thickness of the polyester film 11. When using a 100 μm-thick polyester film 11, for example, it will be eventually possible to obtain a decrease or increase in the line width by 110 μm. Controlling the amount of exposure to light will permit additional, fine line-width adjustment of up to about 30 μm.

The films with line widths controlled in the way just described are, as shown in FIG. 5, a positive film 14 with a circuit-pattern width narrower than the desired pattern by X mm and a negative film 15 broader than the desired pattern by X mm for forming the aforementioned negative film 16. As shown, the two different films are superposed face to face and exposed together to light, so that the difference in pattern between the positive film 14 and the negative film 15 is projected on the unexposed film 12 as a pattern with a line width of 2X mm centered on the contour line 1 of the desired circuit pattern. The film 16 in FIG. 2(1) is formed in this way. Similarly, in order to obtain the positive film 17, the positive film 14 narrower and the negative film 15 wider, respectively, than the portion extended a distance of Y mm from the desired circuit pattern width, by X mm, are used to form a pattern with a line width of 2X mm centered in the portion wider than the desired circuit-pattern width by Y mm.

Next, the positive film 18 wider than the desired circuit-pattern width by Y mm is formed in a similar way. The die material surface is coated with a negative photoresist by dipping, spinning, spraying or the like to form a coat about 4 to 5 μm in thickness, and then the coated surface is prebaked. Using the negative film 16, a line pattern with a width of 2X mm centered on the contour line 1 of the desired circuit pattern is exposed to light and is developed with a designated developer to the state shown in FIG. 1(3). In the same manner, the positive photoresist is applied thereon to a thickness of about 5 to 7 μm, prebaked, registered to the line pattern 3 of the negative photoresist by means of the positive film 17, and the positive film is positioned exactly thereover. After exposure through the two positive films the latent image is developed with a designated developer. In this way a coating pattern 5 for a laminated circuit can be formed over the pattern 3.

Figure 7:
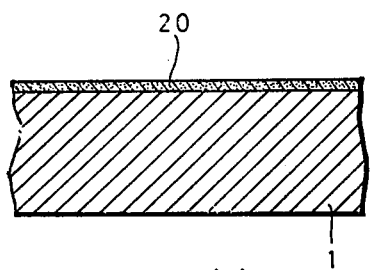
FIG. 7(1) is an enlarged, fragmentary sectional view of a die material prepared on the surface and coated with a positive photoresist for the manufacture of a die in another embodiment of the method of the invention.
Figure 7:
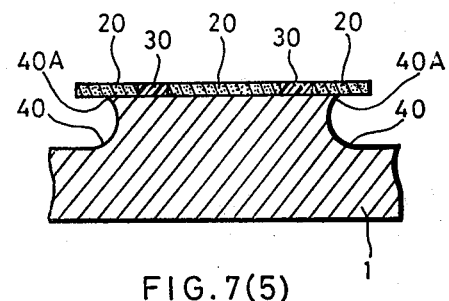
Figure 7:
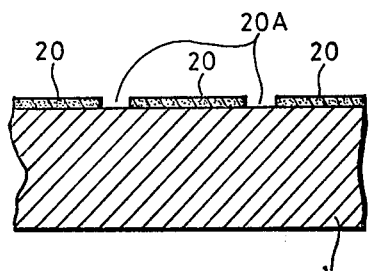
Figure 7:
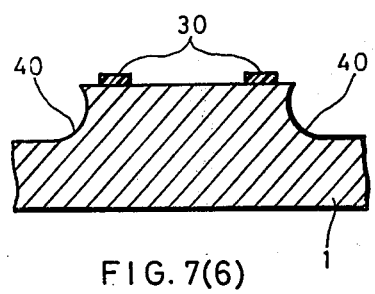
Figure 7:
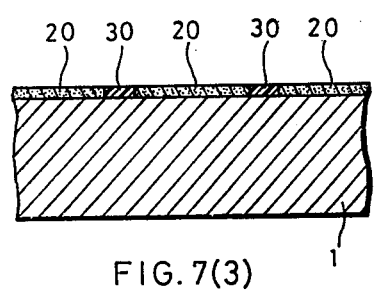
Figure 7:
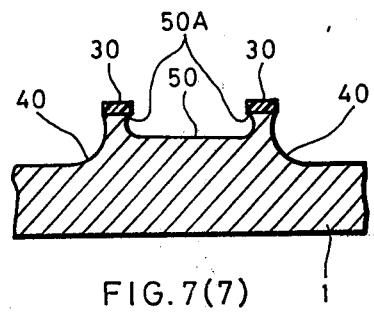
Figure 7:
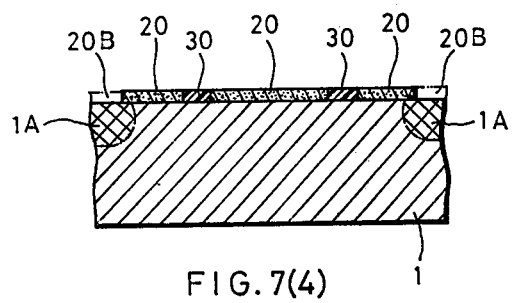
Figure 7:
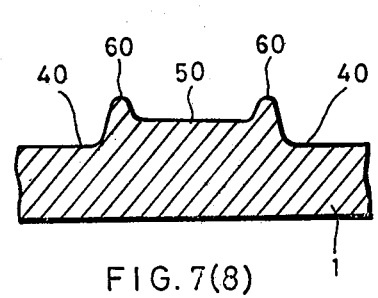

FIGS. 7(1) through (8) show a modified sequence of process steps in accordance with the present invention. First, the surface of the die material 1 to be used is heat-treated to a suitably increased hardness, mechanically polished to a depth of about 0.2 to 0.3 mm, and then finished by a suitable chemical treatment, such as pickling with phosphoric acid or the like following deoxidation with vaporized trichloroethylene or the like. Before the prepared surface oxidizes, it is rapidly coated, as shown in FIG. 7(1), with a positive photoresist, for example, of the diazo type to form a coat 20 thereon. This positive photoresist coat 20 is exposed to light, using a positive photoresist film of FIG. 9(1) to be described later, and is developed to remove the resist coat 20 selectively, as is seen in FIG. 7(2), leaving behind a looped spacing 20A which will fully occupy the edging, or contour, of the desired circuit pattern in the coat 20. In the next step as in FIG. 7(3), the looped spacing 20A is filled by plating at 30 with a metal material, such as lead or gold, or with solder. As a result, the plating 30 forms a first coating pattern characterized by an extremely high resistance as compared with that of the resist coat 20. According to the invention, preparation is made here for the grooving in the subsequent step of the process for the reception of embossed metal foil. As will be clear from FIG. 7(4), a positive photoresist film to be described later in connection with FIG. 9(2) is employed, and, in order that the resist coat 20 may have a second coating pattern suitably larger in size than the plating 30, the outer portion 20B of the coat 20 adjacent to the plating 30 is immediately stripped and removed by means of exposure to light and development. Following this, as shown in FIGS. 7(4) and (5), the cross-hatched portion 1A of the die material 1 below the surface portion uncovered by the removal of the adjacent portion 20B is removed by etching to a desired depth. Thus, the grooving 40 for receiving embossed metal foil is formed, with a slight overhang 40A left under the resist coat 20. The etching solution for this purpose may usually be a ferric chloride solution having a Baume reading of about 37° and heated to about 50° C. It permits etching to be performed satisfactorily without giving any adverse effect on the resist coat 20, to say nothing of the plating 30. As noted above, the plating 30 is by far the more resistant than the resist coat 20, and therefore it is possible after the etching treatment to expose the entire surface of the resist coat 20 to light and then remove it by the action of a developer or, alternatively, to remove the coat without the prior exposure but directly with a stripping solution, such as "AZ 111", which is the trademark of a Shipley Co.'s product (FIG. 7(6)). In this stage the overhang 40A is suitably removed, leaving substantially a vertical wall behind. The uncovered metal portion of the die material thus surrounded only by the plating 30 is suitably removed by etching to a desired depth, as shown in FIG. 7(7), thus forming a recess 50 shallower than the grooving 40. The recess 50 has some overhang 50A along its edge, which is satisfactorily removed by soft etching of the plating 30 in the final step while, at the same time, forming a blade 60 conforming to the contour of the desired circuit pattern, as illustrated in FIG. 7(8). Because of the rapid chemical reaction it undergoes, the overhang can be removed without imparting an adverse effect upon the remaining portion of the resulting die. In order to minimize the overhanging, it is very effective to add, in advance, an agent for preventing side etching to the etching solution. The die thus fabricated as in FIG. 7(8) is ready for direct use.

Figure 8:
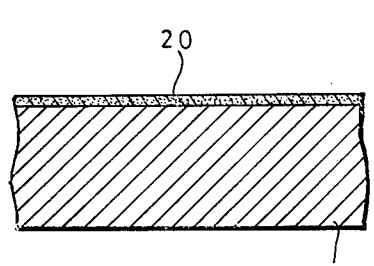
FIG. 8(1) is an enlarged, fragmentary sectional view of a die material prepared on the surface and coated with a positive photoresist, in the same manner as in FIG. 7(1), for the manufacture of a die in still another embodiment of the invention.
Figure 8:
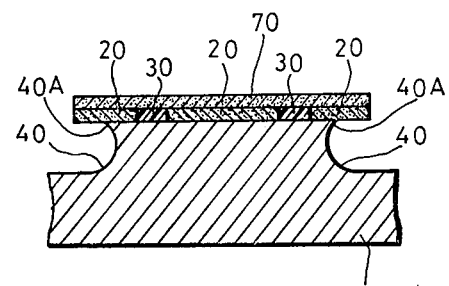
Figure 8:
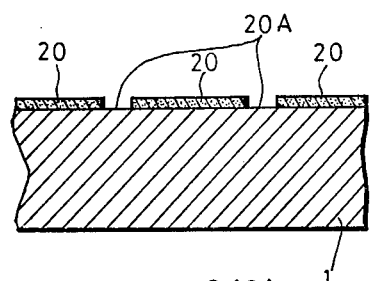
Figure 8:
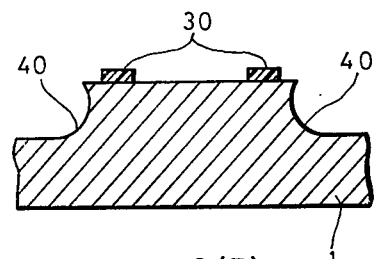
Figure 8:
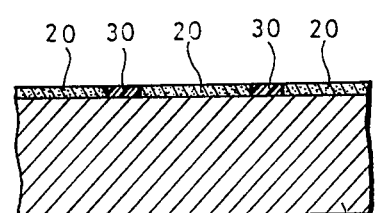
Figure 8:
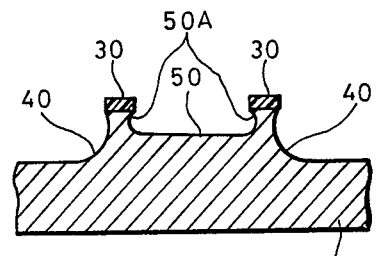
Figure 8:
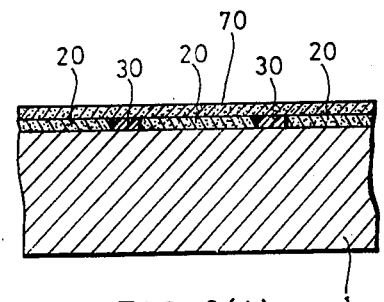
Figure 8:
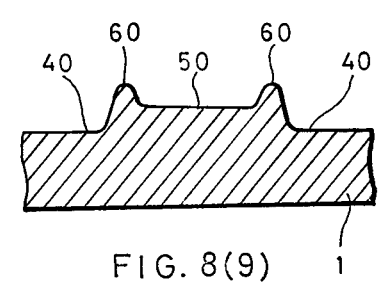
Figure 8:
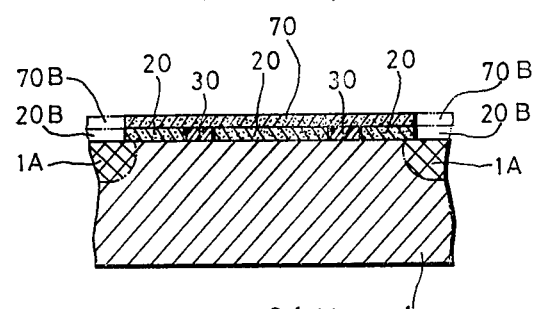

FIGS. 8(1) through (9) illustrate another modified sequence of process steps embodying the invention. As can be seen, the steps of FIGS. 8(1) to (3) and (7) to (9) correspond to those of FIGS. 7(1) to (3) and (6) to (8), respectively. In this modified sequence, the previous step of removing the portion of positive photoresist coat 20 corresponding to the edging, or contour, of the desired circuit pattern and filling the resulting space with plating 30 is so modified that, as shown in FIG. 8(4), an additional positive photoresist coat 70 of the same material as the resist coat 20 is formed over the latter and the plating 30 so as to reinforce the coat 20 substantially as a second coating pattern. Next, as indicated in FIG. 8(5), the outer portions 20B, 70B of the both coats 20, 70 adjacent to the plating 30 are removed by exposure to light and development in the same manner as in FIG. 7(4), thus uncovering the surface of the die material 1. Then, the work is subjected to a similar etching treatment to form a grooving 40 for receiving the embossed metal foil (FIG. 8(6)). An overhang 40A is formed, too. By this procedure the resist coat 20 is substantially reinforced by the additional resist coat 70 and the etching treatment for forming the grooving 40 can be effectively and rapidly accomplished. This reinforcing procedure is best adapted for applications where the die is to have a grooving 40 of an increased depth for receiving embossed metal foil with a thicker circuit pattern or where a circuit pattern more minute and complex than usual is to be obtained.

In the both embodiments of the invention described above, the pattern of the spacing 20A to be filled with the plating 30 and the patterns of the resist coats 20, 70 as in FIGS. 7(4) and 8(5) are formed in the following way. As shown in FIG. 10(3), a positive film 21 and a negative film 22 for combined use in preparing a positive film 23 that corresponds to the pattern of the spacing 20A, and a positive film 24 that corresponds to the patterns of the resist coats 20, 70 are made in advance. The positive film 23, as is clear from FIG. 9(1) and in FIGS. 10(1) and (2), is made to have a line pattern N that covers an area extended and equal distance of X mm from the both sides of the edging, or contour line l, of the desired circuit pattern O as indicated by a broken line. The other positive film 24, as shown in FIGS. 9(2) and 10(4), is made to provide a line pattern P uniformly extended a distance of Y mm from the contour line l. Here the values X and Y are chosen according to the formulas and conditions already given in connection with FIGS. 3(1) and (2) and 6. The negative and positive films 21, 22, 23 and 24 are actually made, in the same way as already described with reference to FIGS. 4 and 5, by suitably controlling the conditions of exposure during reversal of the master films corresponding to the individual films. The description of the particulars are, therefore, not repeated here.

EXAMPLE 1

Carbon tool steel as the die material was cut to a desired size, and the workpiece so obtained was machined and smoothened on the surface, and then heated to a temperature between 750° and 780° C. After this, it was thrown into water or oil for quenching to increase the material hardness. The workpiece was further heated at between 150° and 200° C., and quenched in water or oil for added toughness. The heat-treated work surface was ground well with abrasive and water, and the polished surface was washed with "Chlorothene" (trademark for a chlorinated organic solvent made by Dow Chemical Co.). The work surface thus obtained was corroded in a 20% phosphoric acid solution preheated to 77° C. ± 3° C. to a sufficient roughness to retain a photoresist thereon. The corrosive solution was removed by spraying water at a pressure of 2 kg/cm$^2$ against the surface, and finally the die material was thoroughly dried.

The surface of the die material pretreated in the manner described was evenly coated with "Micro-resist 752" (trademark of a negative photoresist made by Eastman Kodak Co.) to form a coat 7 to 12 μm in thickness thereon. The coated surface was air-dried for 20 to 40 minutes, and heated in an oven at 95° to 115° C. for 60 to 90 minutes, and then cooled by standing in air. The application of this negative photoresist was carried out under a yellowish or orange light to which the resist coat was not sensitive enough to be exposed.

In order to form a sufficiently large coating pattern to cover the side edge, or contour line, of the desired circuit pattern, using the resist coat obtained as above, a negative film (FIG. 2(1)) that had been prepared beforehand was placed, with its patterned surface downward, over the negative photoresist coat. To obtain an intimate contact between the resist coat and the negative film, a polyester sheet and a polyvinyl chloride sheet were superposed, in that order, over the negative film and they were altogether subjected to the action of vacuum so that the both sheets could press the negative film against the resist coat. During this, the negative photoresist coat was exposed to an ultraviolet light of an intensity of 80 to 120 W per centimeter square of the negative film, from an ultra-high pressure mercury lamp of a 4-KW capacity held at a height of about 60 cm above the resist coat. After the exposure, the negative film was taken off from the resist coat, and Chlorothene at 15° to 22° C. was sprayed over the exposed resist coat at a pressure of about 5 kg/cm$^2$ for 15 to 25 seconds. Next, water was sprayed over the die material surface at a pressure of 1 to 2 kg/cm$^2$ to wash away the Chlorothene from the surface. The entire piece was heated at about 160° C. for 60 to 120 minutes for added bond strength between the die material and the resist coat thereon, and a complete coating pattern, with which the resist coat fully occupied the contour line of the desired circuit pattern, was formed. The coated die material was then allowed to stand for cooling in air.

Following this, Shipley's photoresist AZ 111 in a diluted form was applied to form a positive photoresist coat, 7 to 12 μm thick, over the die material surface including the coating pattern described above. The die material with the resulting coat was air-dried for 40 to 70 minutes and in an oven at 95° to 110° C. for 40 to 80 minutes, and then cooled by standing in air. The above-described steps were performed under yellowish or orange light.

Next, a positive film (FIG. 2(2)) that had been formed in advance was placed over the positive photoresist coat, in register with the coating pattern of the negative photoresist formed in the manner already stated. Another positive film (FIG. 2(3)) was placed over the positive film in good register, and a polyester sheet and a polyvinyl chloride sheet were superposed over the second positive film, and then the both positive films and the second resist coat were subjected to a vacuum action for establishing an intimate contact therebetween. Meanwhile, a 4-KW ultra-high pressure mercury lamp located at a height of about 60 cm above the resist coat was operated, and the resist coat was exposed to an ultraviolet light with an intensity of 80 to 120 W/cm$^2$ of the film surface. The exposed resist coat was dipped in a developer consisting of "Developer 303" of Shipley Co. and 2% NaOH at 20° to 26° C. for 90 to 150 seconds for removal of unwanted portions. The surface was thoroughly washed with water at a pressure of 1 to 2 kg/cm$^2$ to remove the remaining developer. The water was wiped off, and the coated surface was dried by heating the entire die material at about 100° C. for 90 to 150 minutes, and it was air-cooled. In this manner a second coating pattern corresponding to that shown in FIG. 1(5), with increased bond strength between the positive photoresist coat and the base material surface, was formed.

Prior to the subsequent etching step, an etching solution was prepared which consisted of 76 parts of a ferric chloride solution having a Baume reading of 40°, 21 parts of water, and 3 parts of a 35% hydrochloric acid solution. This etching solution, heated at 50° ± 5° C., was sprayed at a pressure of 2.0 ± 0.5 kg/cm$^2$ over the die material surface formed with the both coating patterns to etch the uncovered metal portions to a depth of 0.25 to 0.70 mm. The treatment was carried out on an etching machine for a period of 5 to 30 minutes. After the etching, the die material surface was thoroughly washed with water to remove the etching solution.

After the grooving, for receiving the embossed metal foil, by the etching means just described, the positive photoresist coat as the second coating pattern was removed. For this purpose, a 4-KW ultra-high pressure mercury lamp held at a height of about 60 cm above the resist coat was lighted, and the film was exposed by irradiation with an ultraviolet light of 100 to 120 W/cm$^2$. The die material with the exposed resist coat was dipped in a developer consisting of Shipley's Developer 303 and 2% NaOH at 20° to 26° C. for 120 to 180 seconds, so that the positive resist coat could be removed. Thereafter, the die material surface was washed with water to remove the remaining developer from the surface, and water was wiped off. In this way the first coating pattern of the negative photoresist coat alone was left over the die material surface.

Next, the surface of the die material placed in the etching machine was sprayed with an etching solution consisting of 76 parts of a ferric chloride solution having a Baume reading of 40°, 21 parts of water, and 3 parts of a 35% hydrochloric acid solution, at a temperature of 50° ± 5° C. and at a spray pressure of 2.0 ± 0.5 kg/cm$^2$ for 2 to 10 minutes. The metal portion surrounded by the negative photoresist coat was thus etched away to a depth of 0.10 to 0.25 mm. After the etching, the die material surface was washed by spraying with water, and the water was wiped off. Thus, in this step, a recess was formed for enabling the embossed metal foil to be pressed against the substrate of a circuit.

The negative photoresist coat as the first coating pattern was then removed by dipping in the same stripping solution as mentioned above for one to five minutes. To wash away the stripping solution, the die material surface was thoroughly sprayed with water, and the water was wiped off. In the final step, the die material surface was dipped in the above-mentioned etching solution at 50° ± 5° C. for 20 to 40 seconds. The undercut formed during etching was thus removed, and a die with a knife-edge protrusion corresponding to the contour of the desired circuit pattern formed on the surface was obtained. In this example, the X and Y values used in accordance with FIGS. 3(1) and (2) were X = 50 ~ 100 μm and Y = 100 ~ 300 μm.

EXAMPLE 2

A die material surface was finished in the same manner as described in Example 1, and was coated evenly with Shipley Co.'s positive photoresist AZ 111 in a diluted form to form a coat 7 to 12 μm in thickness. The coated die material was air-dried for 40 to 70 minutes, heated in an oven at about 100° C. for 40 to 80 minutes, and cooled by standing in air. Over the positive photoresist coat thus formed was placed a negative film of FIG. 10(3), and the resist coat was exposed to light under the same conditions as in Example 1. It was developed with a solution of Shipley's Developer 303 and 2% NaOH, unhardened portion was removed with Chlorothene, and a spacing that would cover the contour of the desired circuit pattern was provided. To remove the developer used, the die material was washed with water and wiped clean. It was then heated in an oven at about 100° C. for 60 to 90 minutes for added bond strength between the resist coat and the underlying die material surface, and was cooled in air.

For acid-proof plating of the spacing thus formed, a plating operation was carried out, using Tanaka Precious Metal Co.'s "Autoronex CI", an acidic gold plating solution, with a current density of 1 A/dm$^2$ for 20 to 30 minutes. The spacing was thus plated with soft gold of 99.9% purity to a thickness of 3 to 4 μm. Then, using the positive film of FIG. 10(4), the work surface was exposed to light and developed in the same way as in Example 1 to remove the unwanted, unhardened portion of the positive photoresist coat. Again in the same manner, the uncovered metal portion of the die material was partly etched to provide a grooving, 0.25 to 0.70 mm in depth, for subsequently receiving the embossed metal foil.

Next, the positive photoresist coat was stripped as in Example 1, and the uncovered metal portion of the die material surrounded by the pattern of soft gold plating was etched on an etching machine to the same depth of 0.10 to 0.25 mm as in the preceding example, thus forming a recess which will permit the embossed metal foil to be pressed against the circuit substrate. The remainder of the plating was then removed with abrasive and water from the die material surface, and, in the same manner as already described, the workpiece was soft-etched by dipping in the etching solution for 20 to 40 seconds, and a complete die free of overhanging was obtained. In this example the conditions not specified were identical with those used in Example 1.

EXAMPLE 3

The procedure of Example 2 was repeated up to the step of forming the positive photoresist coat and soft gold plating on the die material surface. Over the surface thus coated and plated, an additional coat, 7 to 12 μm in thickness, was formed of a positive photoresist, Shipley's AZ 111 in a diluted form. In the same way as in the preceding example, the coated surface was air-dried, heated in an oven, and allowed to cool by standing in air. Then, in the same manner as in Example 2, the resist coat was exposed to light using the positive film and was developed to remove the unhardened portion, the workpiece was grooved on the etching machine for the reception of embossed metal foil, and the resist coat was stripped away with methyl ethyl ketone to uncover the gold plating. Thereafter, the same treatments as in Example 2 were carried out and a finished die was obtained.

According to the method of the invention, as described hereinbefore, the first and second circuit-coating patterns are initially formed and immediately the grooving for receiving the embossed metal foil is provided. This eliminates the necessity of preforming such grooving and filling a resin therein as in conventional methods. Moreover, the two patterns can be formed simply and accurately. It is therefore possible to manufacture dies of high quality efficiently with a minimum of process steps and at low cost.

Also, according to the present method of manufacturing a die for embossing a circuit pattern, the step of forming the second circuit-coating pattern of a resist coat or the like so as to leave the edging, or contour, of the desired circuit pattern and the step of forming the first circuit-coating pattern obtained by plating the spacing provided by the preceding step can be simply and rapidly concluded. Since the first coating pattern can be made to have by far the greater resistance than the second pattern, the subsequent step of grooving for the reception of the embossed metal foil can be performed easily and accurately, the resulting groove being best suited for the thickness of the metal foil of the circuit pattern to be embossed. In connection with these features, it is further possible according to the invention to form a third coating pattern which substantially adds to the thickness of the second coating pattern, so that a die for embossing a more delicate circuit pattern with a greater accuracy can be manufactured.

What is claimed is:

1. A method of manufacturing a die for embossing a circuit pattern of metal foil onto a substrate having a circuit pattern, the die to be manufactured having two raised blades, the width of each defining a contour of the desired circuit pattern, the blades being spaced apart by a first surface or recess and being bordered by a second surface or groove recessed from the blades a greater amount than the first surface, comprising the steps of: forming a coating layer on the die so as to leave the contour of the desired circuit pattern uncoated, forming a first coating pattern on the uncoated area, the coating layer and the first coating pattern being exposed, partly stripping said coating layer to expose the second surface, removing from said second surface a predetermined amount of the die material to form grooving for receiving the embossed metal foil, stripping away the entire coating layer, removing from said first surface and second surfaces a predetermined amount of the die material, and stripping away said first coating pattern.

2. A method of manufacturing a die for embossing a circuit pattern of metal foil onto a substrate having a circuit pattern, the die to be manufactured having two raised blades, the width of each defining a contour of the desired circuit pattern, the blades being spaced apart by a first surface or recess and being bordered by a second surface or groove recessed from the blades a greater amount than the first surface, comprising the steps of: forming a coating layer on the die so as to leave the contour of the desired circuit pattern uncoated, forming a first coating pattern on the uncoated area, forming an additional coating layer of the same material as said coating layer over said coating layer and said first coating pattern, partly stripping said both coating layers to expose the second surface, removing from said second surface a predetermined amount of the die material to form a grooving for receiving the embossed metal foil, stripping away said both coating layers from said first and said second surfaces, removing a predetermined amount of die material from said first and second surfaces, and stripping away said first coating pattern.

3. A method of manufacturing a die according to claim 2 comprising: coating the die surface with a negative photoresist, placing a negative film on the resist coat, exposing said resist coat to light through said film and developing the resist coat to form the first circuit-coating pattern, applying a positive photoresist over the die surface including said first coating pattern, placing a positive film on the resulting positive photoresist coat, exposing said resist coat to light through said film and developing the resist coat to form the second circuit-coating pattern which exposes the second surface, etching the second surface to a desired depth, stripping away said second circuit-coating pattern by full exposure to light and development, etching the first and second surfaces to a desired depth, removing said first circuit-coating pattern with a stripping solution, and etching said die material surface to provide the blades.

4. A method of manufacturing a die according to claim 3, wherein said negative film has a line pattern extending a predetermined width from both sides of the contour line of the desired circuit pattern, and said positive film consists of a film having a line pattern extending a predetermined width from both sides of a line a predetermined distance outward of said contour line of said desired circuit pattern and further including another film having a line pattern extending a predetermined distance from said contour line of said desired circuit pattern.

5. A method of manufacturing a die according to claim 3, wherein said etching is performed by use of an etching solution containing an agent for preventing side etching.

6. A method of manufacturing a die according to claim 4, wherein said negative and positive films having the desired line patterns are made by superposing master films with unexposed films through a transparent resin film, with the thickness of said transparent resin film being varied to form said desired pattern.

7. A method of manufacturing a die according to claim 1, which comprises forming a positive photoresist coat on the die material surface, placing a positive film on said resist coat and exposing said coat to light through the film and developing the resist coat to form on said resist coat a spacing which will occupy the contour of the desired circuit pattern, plating said spacing and forming the first circuit-coating pattern, again exposing and developing said positive photoresist coat by use of another positive film to expose the second surface, etching the second surface to a desired depth, exposing said second circuit-coating pattern entirely to light and stripping said pattern with a developer to expose said first surface, etching the first and second surfaces to a desired depth, removing said first circuit-coating pattern, and etching the die material surface to provide said blades.

8. A method of manufacturing a die according to claim 1, which comprises subsequent to forming the first coating pattern with plating in said positive photoresist coat, forming an additional positive photoresist coat of the same material as said photoresist coat over said resist coat and said first coating pattern, so that the two layers of resist coats expose the second surface, etching the second surface, and then stripping away said both positive photoresist coats by full exposure to light and development.

9. A method of manufacturing a die according to claim 1, wherein said positive film for forming said first coating pattern has a line pattern extending a predetermined width from both sides of the contour line of the desired circuit pattern, and the other positive film has a line pattern extended a predetermined distance from said contour line.

10. A method of manufacturing a die according to claim 9, wherein said negative and positive films having the desired line patterns are made by superposing master films with unexposed films through a transparent resin film, the thickness of the transparent resin film to be interposed between the master films and unexposed films being variable so that the line patterns to be formed in said positive films can be controlled to desired dimensions.

11. A method of manufacturing a die for embossing a circuit pattern of metal foil onto a substrate having a circuit pattern, the manufactured die having two raised blades the width of each defining a contour of the desired circuit pattern, said blades being spaced apart by a first surface or recess and being bordered by a second surface or groove which is recessed from the blades a greater amount than the first surface comprising:
(a) forming a first circuit coating pattern on the die which occupies the contour of the desired circuit and which corresponds to the blades;
(b) forming a second circuit-coating pattern which covers the first circuit-coating pattern and the first surface, the second circuit coating pattern exposing said second surface;
(c) removing from said second surface a predetermined amount of die material;
(d) stripping said second circuit coating pattern to expose the first surface;
(e) removing from said first and second surfaces a predetermined amount of die material; and
(f) stripping the first circuit coating pattern.

12. A method according to claim 11 wherein said removing of steps (c) and (e) comprises etching the die with an etching solution.

13. A method according to claim 12 wherein step (a) comprises:
coating the die with a negative photoresist,
exposing said negative resist coat to light, and
developing the negative resist coat to form the first circuit coating pattern.

14. A method according to claim 13 wherein step (b) comprises:
coating the die and the first coating pattern with a positive photoresist,
exposing said positive photoresist to light,
developing the positive resist coat to form the second circuit coating pattern.

15. A method according to claim 1 wherein a stripping solution is used for stripping away the entire second coating pattern and wherein said first coating pattern has a greater resistance to said stripping solution than said second coating pattern.

* * * * *